(12) United States Patent
Heo et al.

(10) Patent No.: US 10,578,900 B2
(45) Date of Patent: Mar. 3, 2020

(54) DISPLAY APPARATUS

(71) Applicant: LG ELECTRONICS INC., Seoul (KR)

(72) Inventors: Jinha Heo, Seoul (KR); Hyunjong Ryu, Seoul (KR)

(73) Assignee: LG ELECTRONICS INC., Seoul (KR)

(*) Notice: Subject to any disclaimer, the term of this patent is extended or adjusted under 35 U.S.C. 154(b) by 133 days.

(21) Appl. No.: 15/711,940

(22) Filed: Sep. 21, 2017

(65) Prior Publication Data

US 2018/0081233 A1 Mar. 22, 2018

(30) Foreign Application Priority Data

Sep. 21, 2016 (KR) .................. 10-2016-0120923

(51) Int. Cl.
*G02F 1/1333* (2006.01)
*G09F 9/30* (2006.01)
*H01L 51/00* (2006.01)

(52) U.S. Cl.
CPC ........ *G02F 1/133308* (2013.01); *G09F 9/301* (2013.01); *G02F 1/133305* (2013.01); *H01L 51/0097* (2013.01)

(58) Field of Classification Search
CPC ........... G02F 1/133308; G02F 1/13336; G09F 9/301; H01L 51/0097
USPC .......................................... 349/58
See application file for complete search history.

(56) References Cited

U.S. PATENT DOCUMENTS

2011/0012858 A1* 1/2011 Brookes ............... G06F 1/162
345/173

FOREIGN PATENT DOCUMENTS

| KR | 101033495 | | 4/2011 |
|---|---|---|---|
| KR | 101033495 | B1 * | 5/2011 |
| KR | 1020110055718 | | 5/2011 |
| KR | 1020120080182 | | 7/2012 |
| KR | 1020120100288 | | 9/2012 |
| KR | 1020140050504 | | 4/2014 |
| KR | 1020140058853 | | 5/2014 |
| KR | 1020140133338 | | 11/2014 |

OTHER PUBLICATIONS

Korean Intellectual Property Office Application No. 10-2016-0120923, Office Action dated Dec. 15, 2017, 6 pages.
(Continued)

*Primary Examiner* — Nathanael R Briggs
*Assistant Examiner* — William D Peterson
(74) *Attorney, Agent, or Firm* — Lee, Hong, Degerman, Kang & Waimey PC

(57) ABSTRACT

Disclosed is a display apparatus. The display apparatus includes a flexible display panel for showing a picture, a panel support member disposed at the rear surface of the display panel for supporting the display panel, and a first hinge member fixed to the panel support member, the first hinge member having a predetermined axis of rotation. The display panel includes a first portion disposed in one side (first side) of two regions divided by an imaginary plane in which the axis of rotation is located and which is perpendicular to a front surface of the display panel and a second portion disposed in the other side (second side). The rear surface of the end portion of the first portion in the first side direction is exposed.

9 Claims, 13 Drawing Sheets

(56) References Cited

OTHER PUBLICATIONS

Korean Intellectual Property Office Application No. 10-2016-0120923, Notice of Allowance dated Jun. 12, 2018, 2 pages.

* cited by examiner

【Figure. 1】
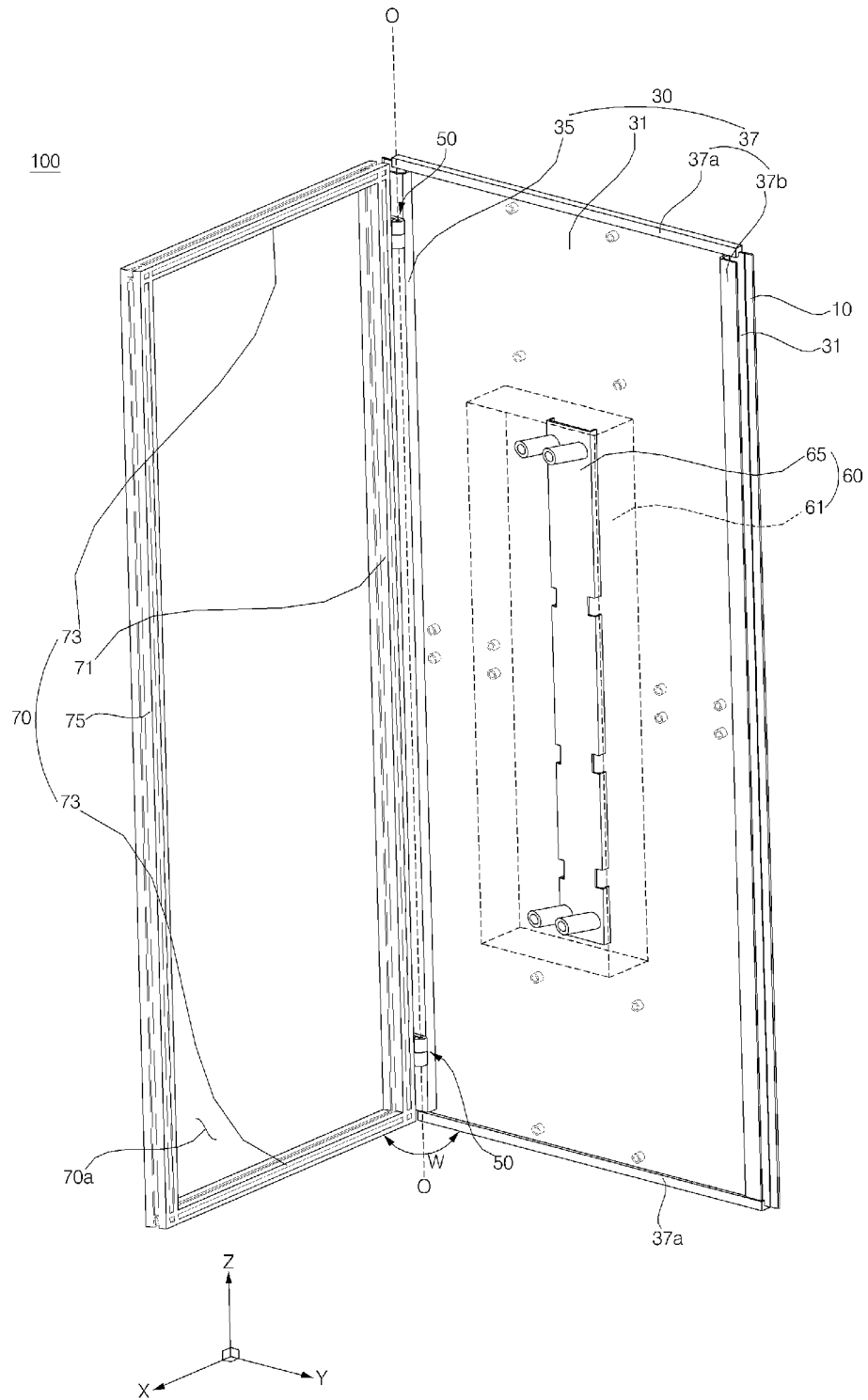

[Figure. 2]
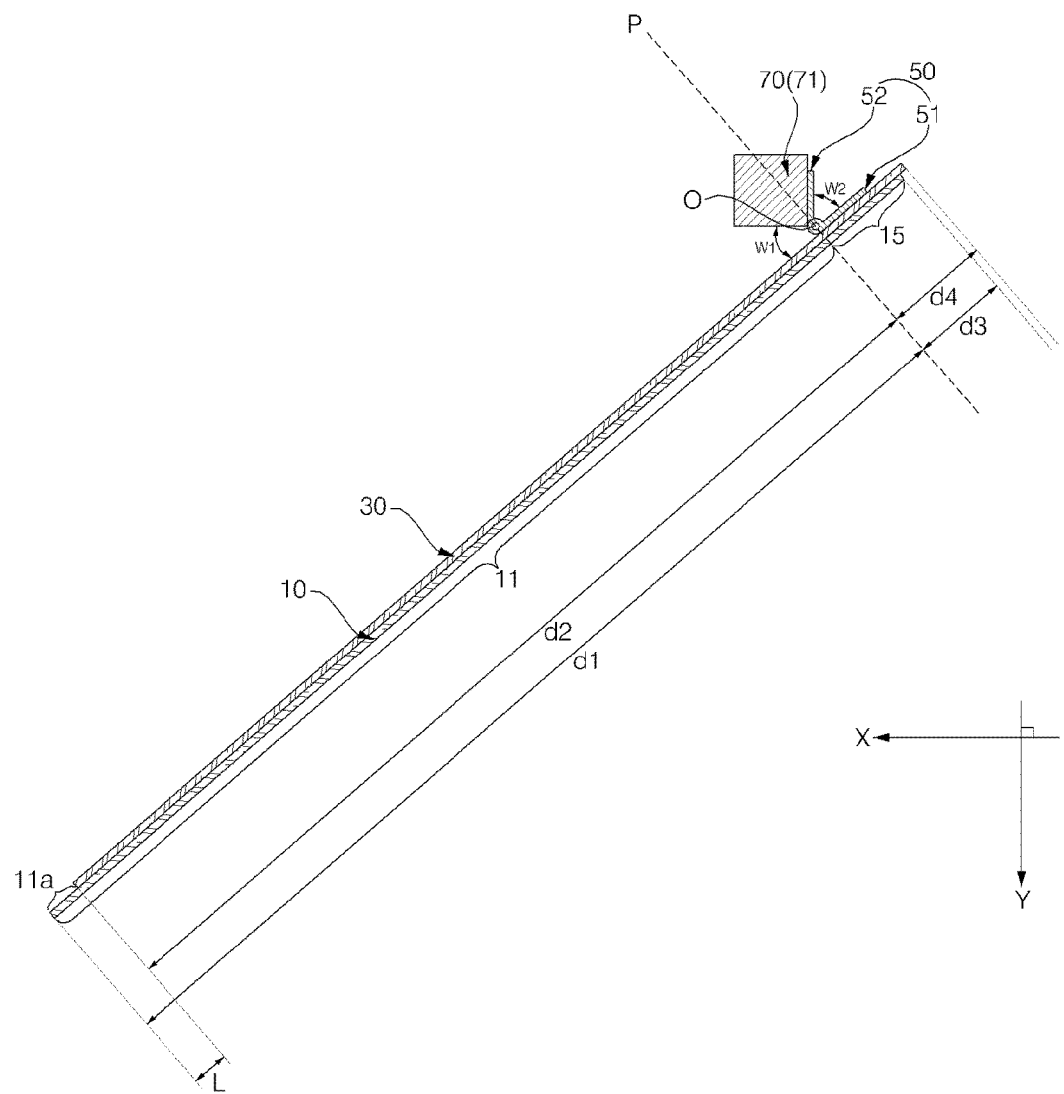

[Figure. 3]
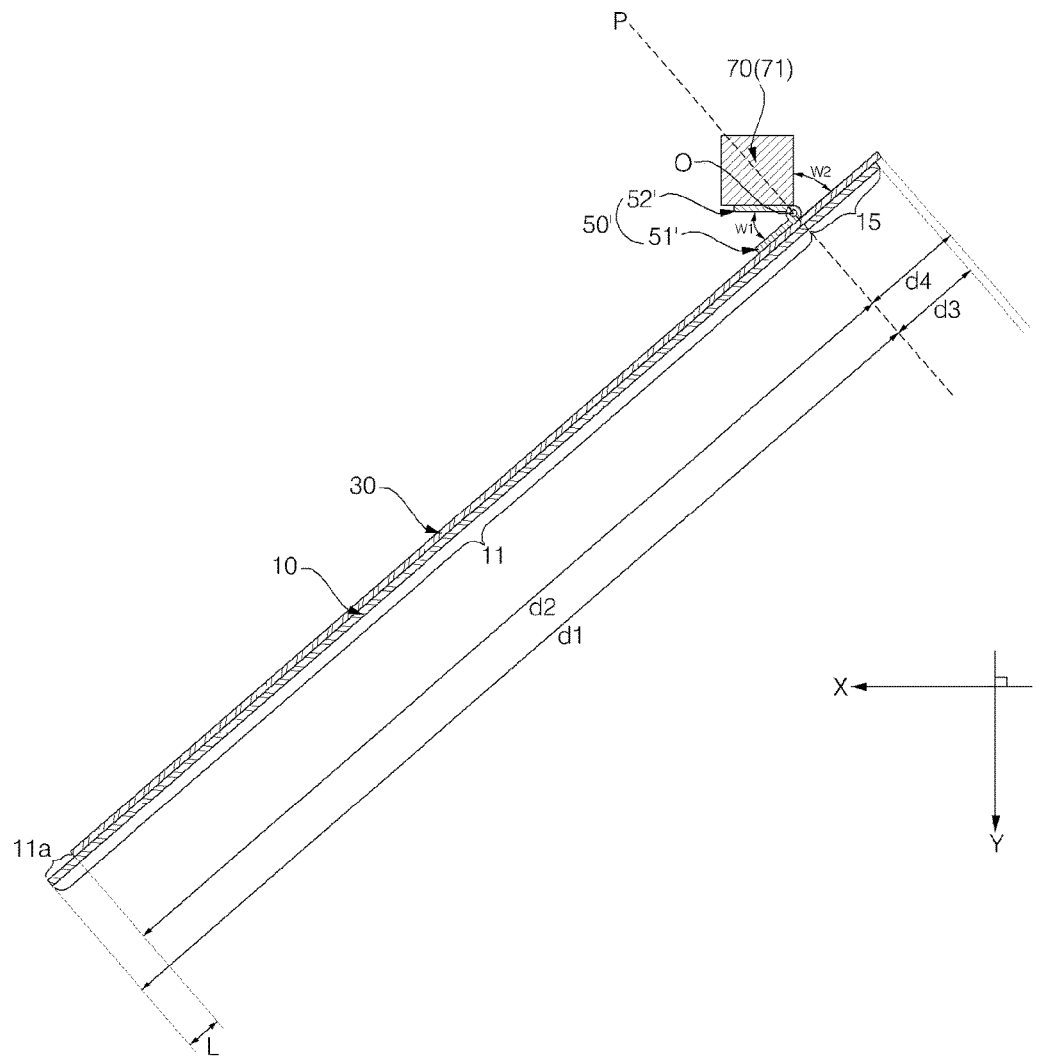

【Figure. 4】
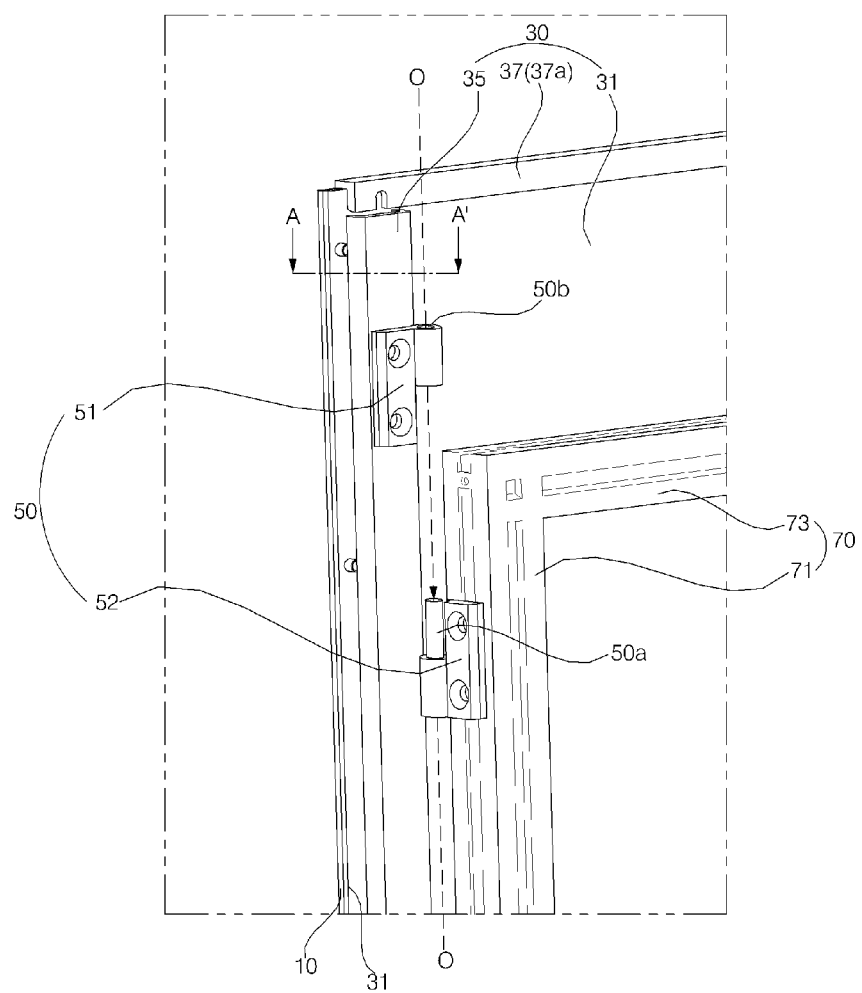

【Figure. 5】
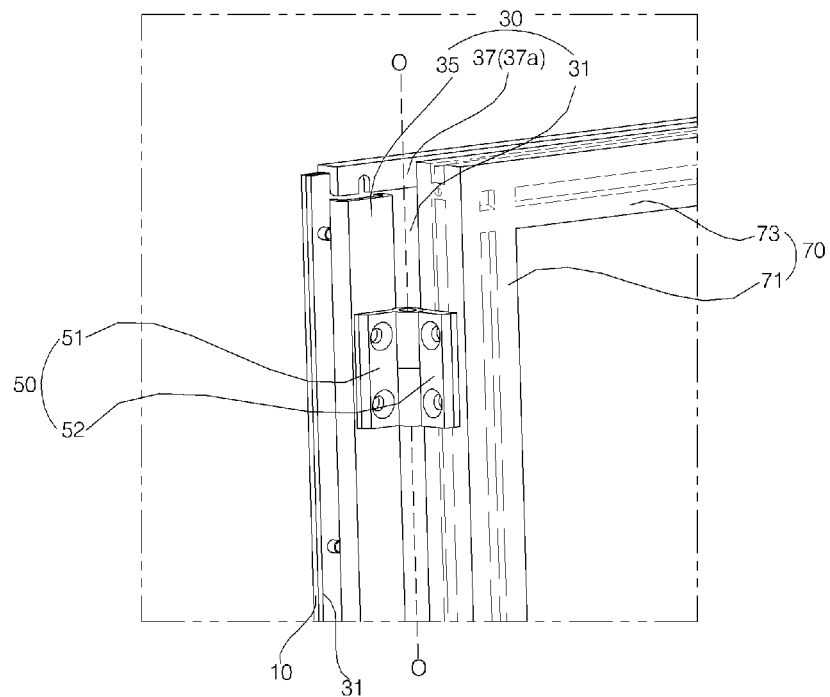
【Figure. 6】
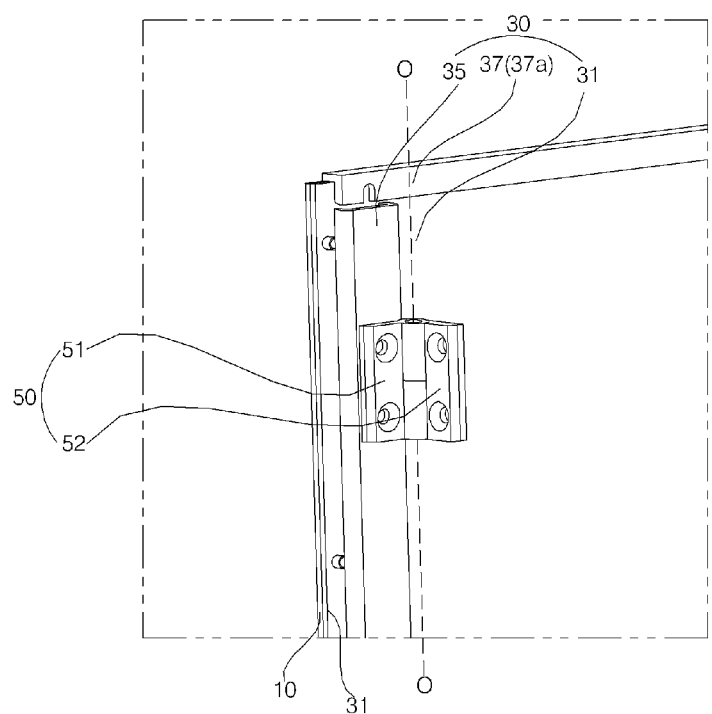

【Figure. 7】
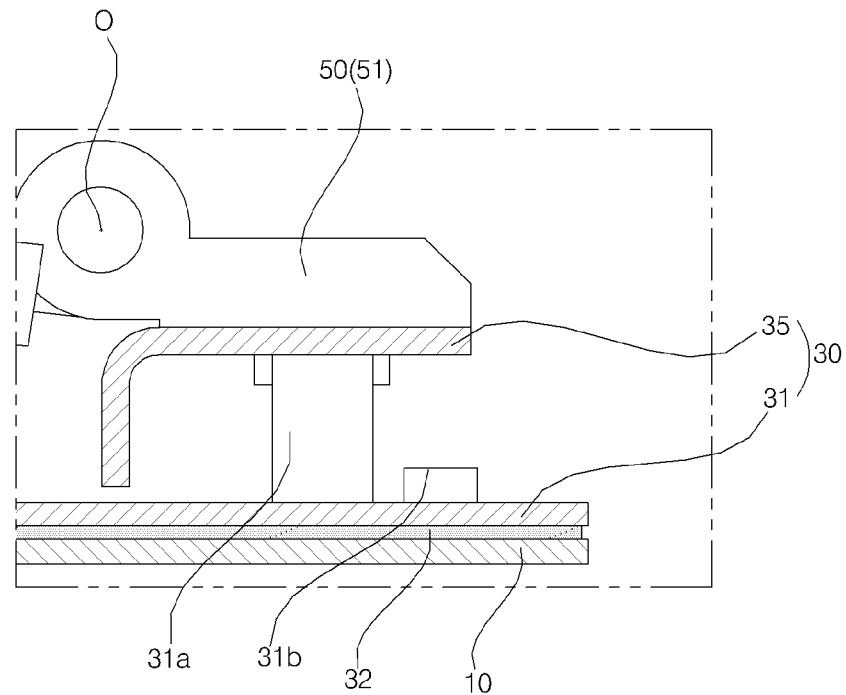
【Figure. 8】
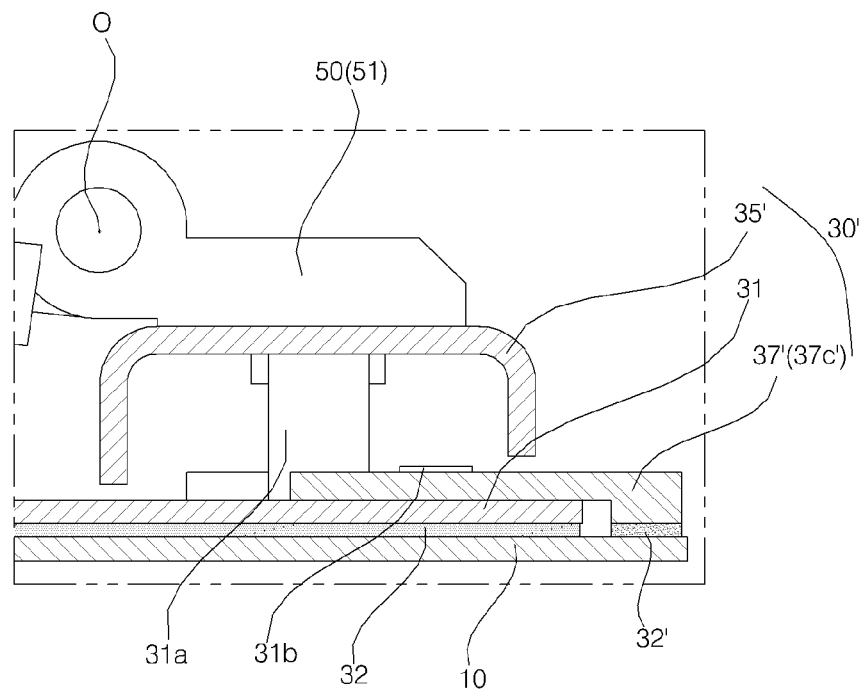

【Figure. 9】
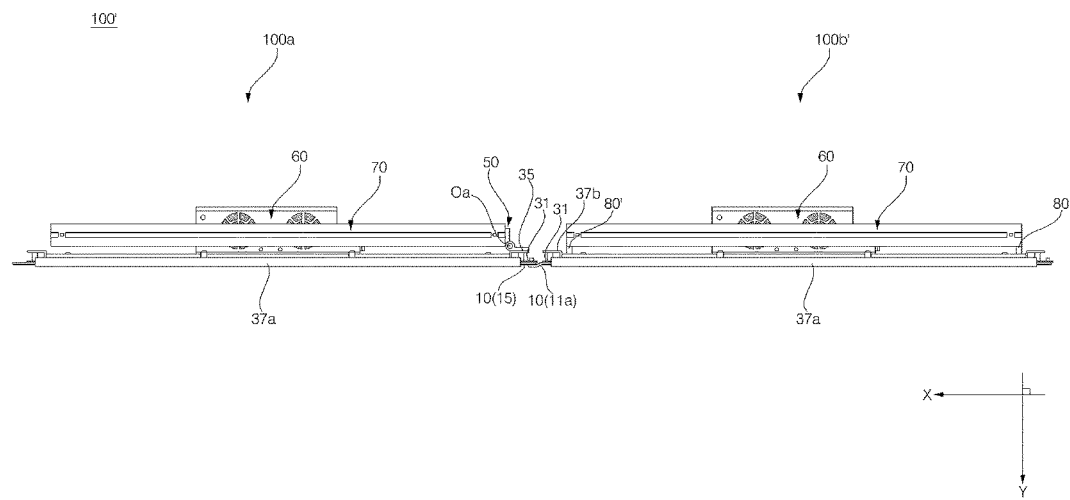
【Figure. 10】
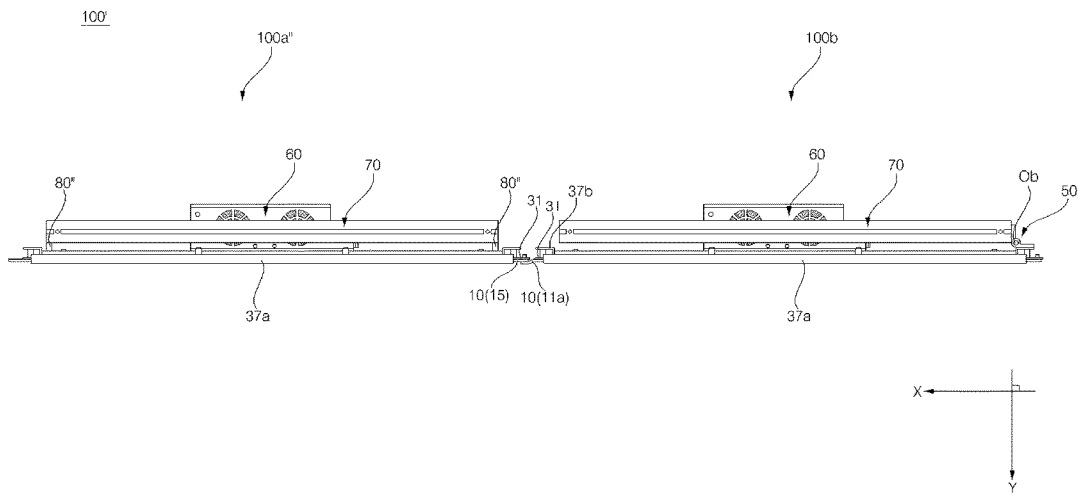

[Figure. 11]
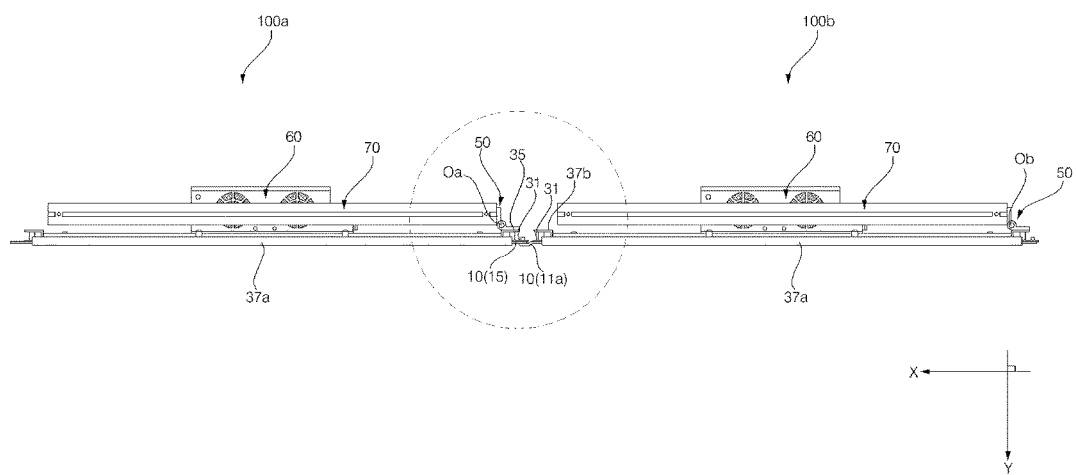
[Figure. 12]
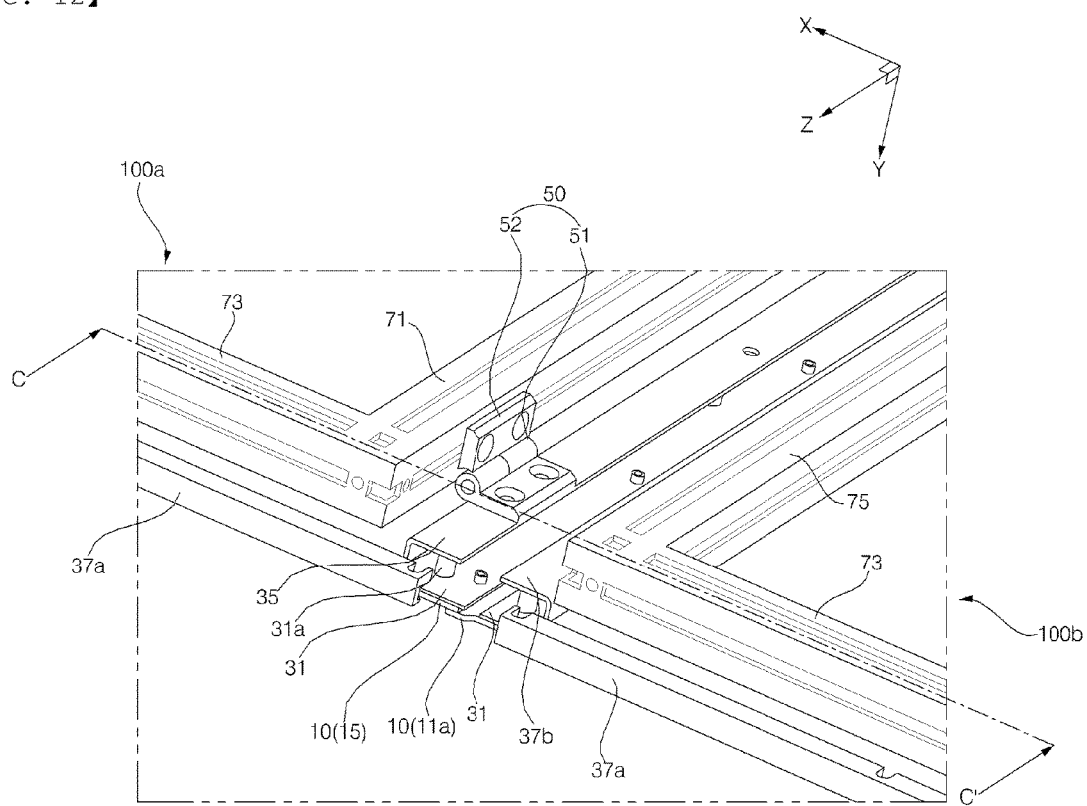

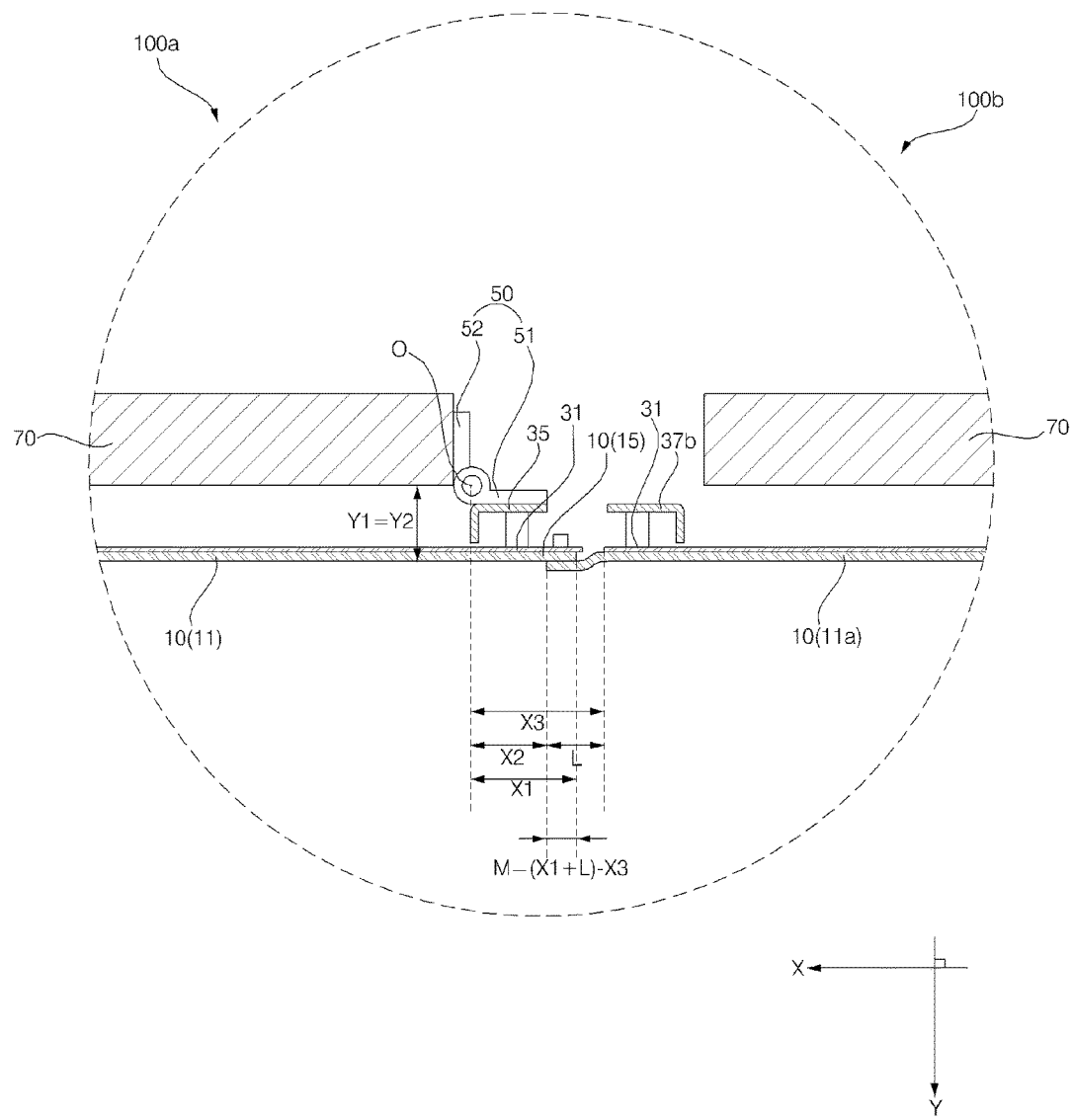
[Figure. 13]

【Figure. 14】
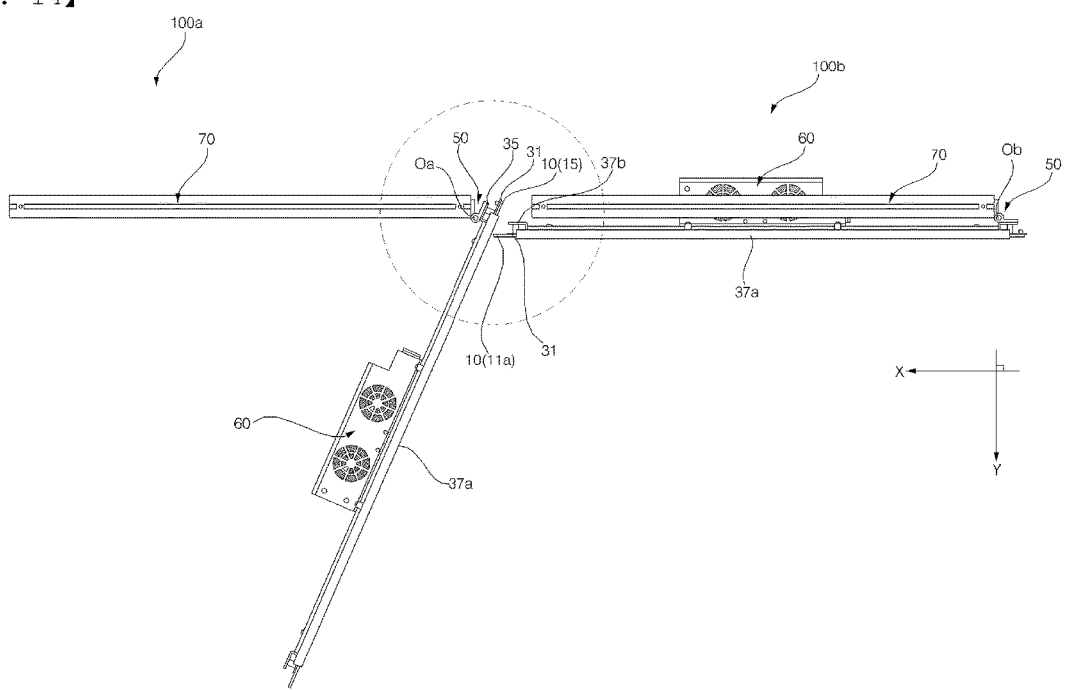

[Figure. 15]
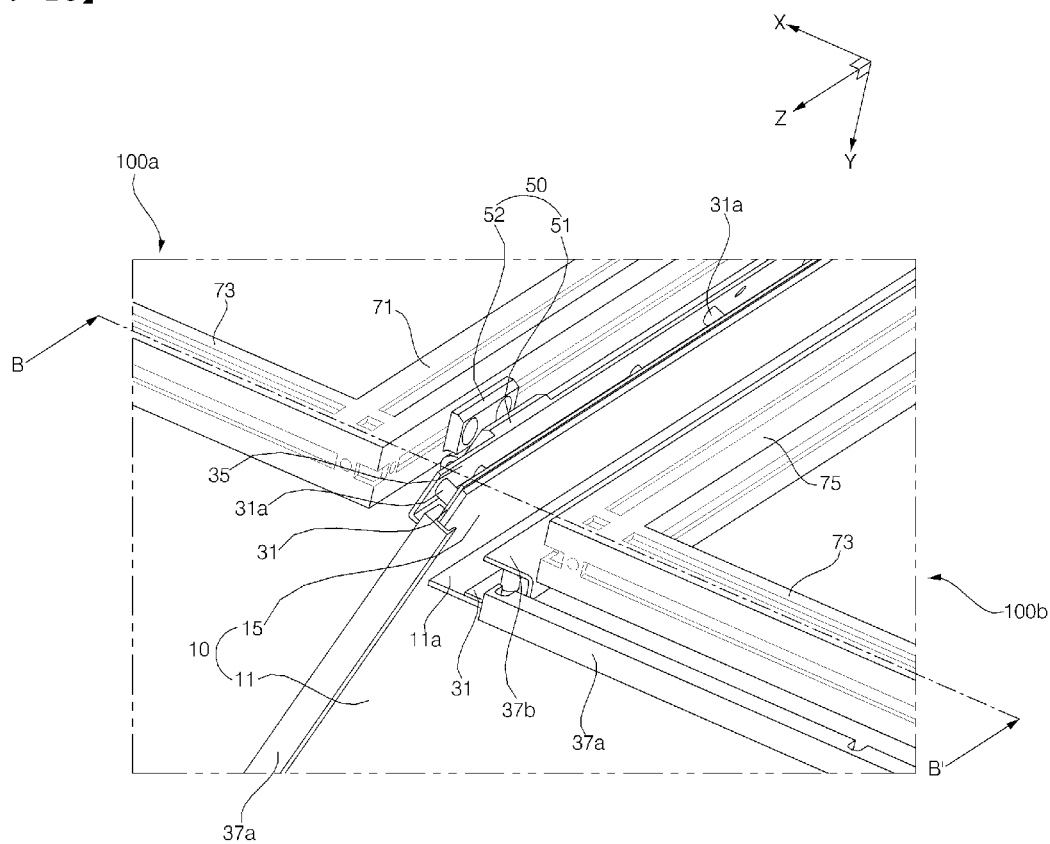

【Figure. 16】
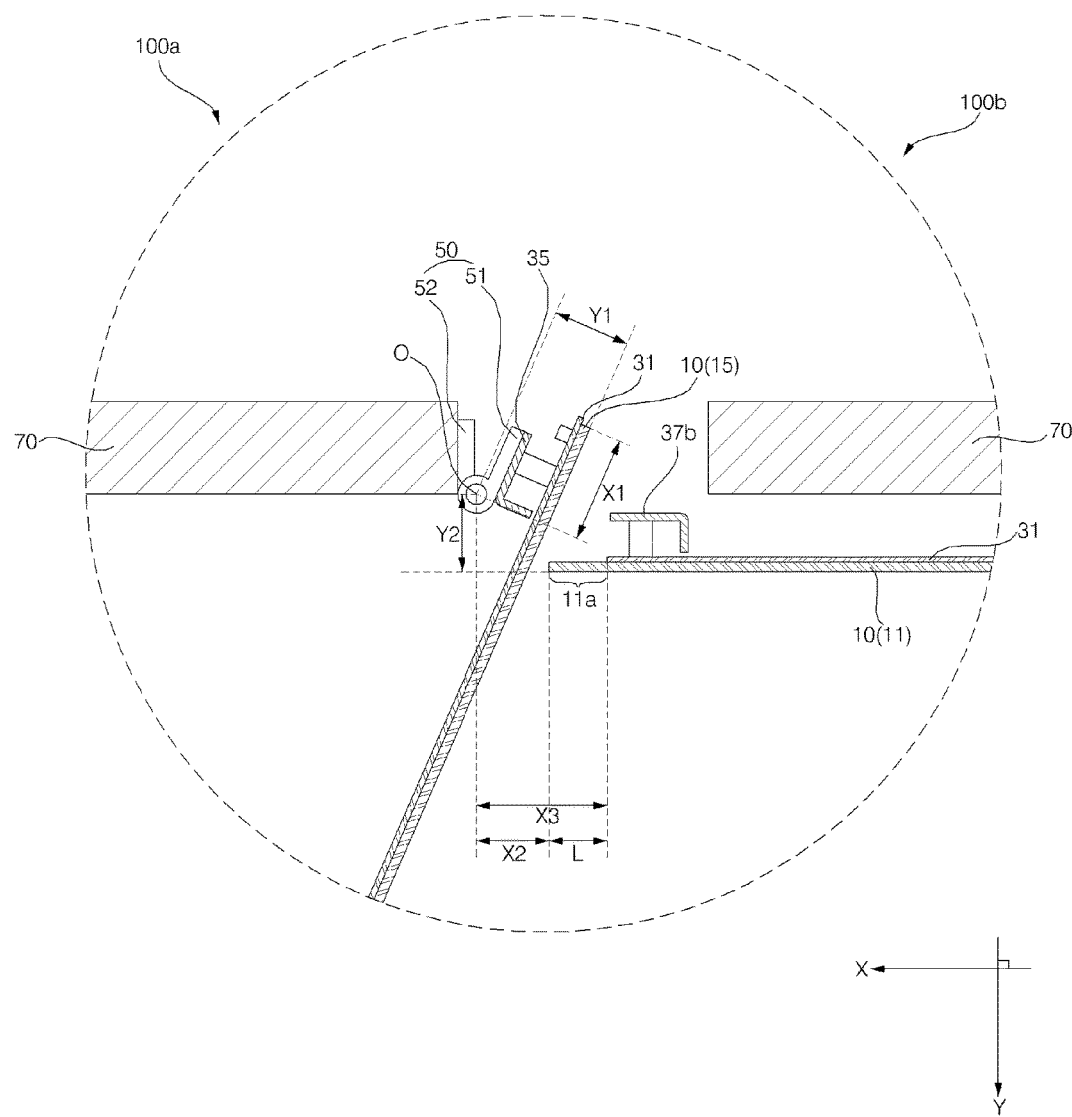

【Figure. 17】
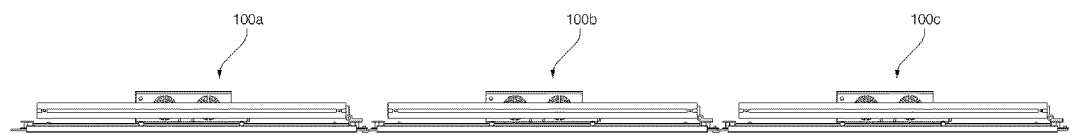
【Figure. 18】
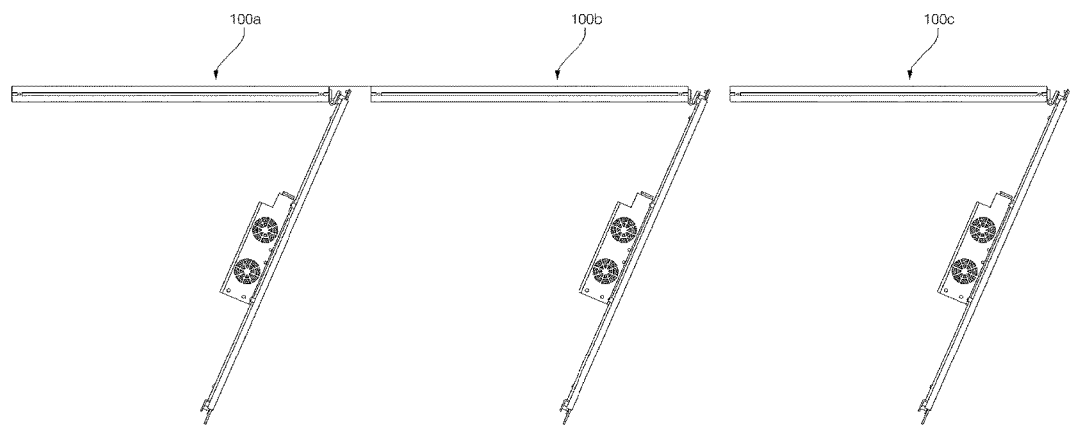
【Figure. 19】
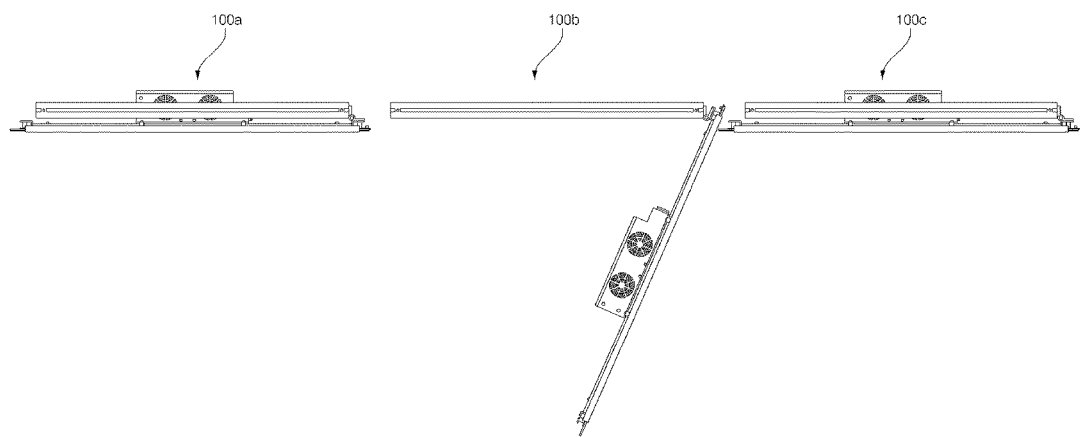

DISPLAY APPARATUS

CROSS-REFERENCE TO RELATED APPLICATION

Pursuant to 35 U.S.C. § 119(a), this application claims the benefit of earlier filing date and right of priority to Korean Patent Application No. 10-2016-0120923, filed on Sep. 21, 2016, the contents of which are all hereby incorporated by reference herein in its entirety.

BACKGROUND OF THE INVENTION

1. Field of the Invention

The present invention relates to a module-type display apparatus, and more particularly, to a display apparatus including a display panel capable of rotating about an axis of rotation.

2. Description of the Related Art

Various kinds of display panels for showing pictures have been used. For example, a liquid crystal display panel, a plasma display panel, and an organic light emitting diode display panel have been used.

Conventional technology for interconnecting a plurality of display panels to output a large-sized picture has been proposed. A support structure for installing display panels is provided, and a plurality of display panels is coupled to the support structure to constitute a display apparatus that outputs a large-sized picture.

SUMMARY OF THE INVENTION

In the conventional technology, however, in the state in which the display panels are connected to each other, only limited space for repairing or replacing one of the display panels is available. In the conventional technology, in order to repair or replace one of the display panels, a display panel(s) adjacent to the display panel to be repaired or replaced must be separated from the support structure and must then be coupled to the support structure together with the repaired display module or a new display module. It is a first object of the present invention to solve this problem by providing a structure in which a plurality of display panels connected to each other can be individually repaired or replaced.

Conventional display panels each have a portion in which no picture is output (a non-picture portion) at the edge thereof. In this case, when the display panels are connected to each other, no picture is output at the interface between the display panels, and thus a picture is shown as being divided. It is a second object of the present invention to solve this problem by minimizing the area of the non-picture portion at the interface between the display panels.

When the conventional display panels are installed, the display panels are sequentially arranged from one side (first side) to the other side (second side) in one direction. In this case, however, there is a limitation on ability to flexibly install the display panels according to circumstances. It is a third object of the present invention to solve this problem by providing a structure in which the direction in which a plurality of display panels is installed can be easily changed according to circumstances.

It is a fourth object of the present invention to provide a display module enabling a plurality of display modules to be connected to each other so as to show a large-sized picture, thereby maximizing efficiency in manufacture and installation.

Objects of the present invention are not limited to the aforementioned objects and other unmentioned objects will be clearly understood by those skilled in the art from the following description.

In accordance with one aspect of the present invention, the above and other objects can be accomplished by the provision of a display apparatus including a flexible display panel for showing a picture, a panel support member disposed at the rear surface of the display panel for supporting the display panel, and a first hinge member fixed to the panel support member, the first hinge member having a predetermined axis of rotation. The display panel includes a first portion disposed in one side (first side) of two regions divided by an imaginary plane in which the axis of rotation is located and which is perpendicular to the front surface of the display panel and a second portion disposed in the other side (second side). The rear surface of the end portion of the first portion in the first side direction is exposed.

The display apparatus may further include a second hinge member coupled to the first hinge member so as to be rotatable about the axis of rotation.

In accordance with another aspect of the present invention, there is provided a display apparatus including a display module, which includes a display panel for outputting a picture and a panel support member disposed at a rear surface of the display panel for supporting the display panel. The display apparatus includes two display modules. At least one of the display modules includes a hinge member fixed to the panel support member for rotating the panel support member about a axis of rotation. The display module including the hinge member is provided so as to have a closed state in which the facing direction of the display panel is a predetermined direction in which the picture is output and an open state in which the display panel is rotated such that the facing direction of the display panel is a direction different from the direction in which the picture is output. In the closed state, a portion of the rear surface of one of the display modules contacts a portion of the front surface of the other of the display modules.

A portion of the rear surface of the display panel of one of the display modules may contact a portion of the front surface of the display panel of the other of the display modules in the state in which the display module including the hinge member is closed.

The display panel of one of the display modules may be configured to be curved when contacting the display panel of the other of the display modules in the state in which the display module including the hinge member is closed, The panel support member for supporting the display panel of one of the display modules may be coupled to the rear surface of the display panel to cover the rear surface of the display panel but to expose a portion of the rear surface of the display panel of the one of the display modules that contacts at least the front surface of the display panel of the other of the display modules.

In the case in which each of the display modules includes the hinge member, each of the display panels of the display modules may include a first portion rotatable while protruding forward in the open state and a second portion rotatable while protruding rearward in the open state. A portion of the front surface of the second portion of one of the display modules may contact a portion of the rear surface of the first portion of the other of the display modules in the closed state.

The display module may further include a hinge support member for fixing the hinge member and supporting the display panel and the panel support member connected to the hinge member.

In accordance with a further aspect of the present invention, there is provided a display apparatus including two display modules, each of which includes a flexible display panel for outputting a picture, a panel support member disposed at a rear surface of the display panel for supporting the display panel, and a hinge member fixed to the panel support member for rotating the panel support member about a axis of rotation. Each of the display modules is provided so as to have a closed state in which the facing direction of the display panel is a predetermined picture output direction and an open state in which the display panel is rotated such that the facing direction of the display panel is a direction different from predetermined picture output direction. The display panel includes a first portion rotatable while protruding forward in the open state and a second portion rotatable while protruding rearward in the open state. In the closed state, a portion of the rear surface of the first portion of one of the display panels contacts a portion of the front surface of the second portion of the other of the display panels.

BRIEF DESCRIPTION OF THE DRAWINGS

The embodiments will be described in detail with reference to the following drawings in which like reference numerals refer to like elements wherein:

FIG. 1 is a perspective view showing a display apparatus according to an embodiment of the present invention;

FIGS. 2 and 3 are sectional conceptual views of the display apparatus of FIG. 1 taken along the XY plane, wherein FIG. 2 is a view showing the display apparatus including a hinge member according to an embodiment and FIG. 3 is a view showing the display apparatus including a hinge member according to another embodiment;

FIG. 4 is a perspective view showing the display apparatus of FIG. 1 before a first hinge member fixed to a panel support member and a second hinge member fixed to a hinge support member are coupled to each other;

FIG. 5 is a perspective view showing the state in which the first hinge member and the second hinge member of FIG. 4 are coupled to each other;

FIG. 6 is a perspective view showing the first hinge member and the second hinge member fixed to the panel support member before the hinge support member is coupled thereto in accordance with another embodiment of FIG. 4;

FIGS. 7 and 8 are sectional views taken along line A-A' of FIG. 4, wherein FIG. 7 is a view according to an embodiment and FIG. 8 is a view according to another embodiment;

FIG. 9 is an elevation view when viewed in the Z-axis direction in the state in which two display modules according to a first embodiment of the present invention are closed;

FIG. 10 is an elevation view when viewed in the Z-axis direction in the state in which two display modules according to a second embodiment of the present invention are closed;

FIG. 11 is an elevation view when viewed in the Z-axis direction in the state in which two display modules according to a third embodiment of the present invention are closed;

FIG. 12 is a perspective view showing a dotted-line part of FIG. 11;

FIG. 13 is a sectional view taken along line C-C' of FIG. 12;

FIG. 14 is an elevation view when viewed in the Z-axis direction in the state in which one of the display modules according to the third embodiment of the present invention is open;

FIG. 15 is a perspective view showing a dotted-line part of FIG. 14;

FIG. 16 is a sectional view taken along line B-B' of FIG. 15; and

FIGS. 17 to 19 are elevation views when viewed in the Z-axis direction in the state in which a plurality of display modules according to an embodiment of the present invention is installed, wherein FIG. 17 is a view showing the state in which all of the display modules are closed, FIG. 18 is a view showing the state in which all of the display modules are open, and FIG. 19 is a view showing the state in which one of the display modules is open.

DETAILED DESCRIPTION OF THE PREFERRED EMBODIMENTS

In order to distinguish between embodiments of the present invention, apostrophes or double apostrophes will be added to reference numerals of components of an embodiment that are identical in name to, but somewhat different in operation from those of another embodiment. Wherever possible, the same reference numerals will be used throughout the specification to refer to the same or like elements.

In the preset invention, an X axis, a Y axis, and a Z axis shown in FIG. 1 and other figures define a rectangular coordinate system, and axis directions (an X-axis direction, a Y-axis direction, and a Z-axis direction) mean the direction in which the respective axes extend. An XY plane means a specific plane including an X axis and a Y axis, a YZ plane means a specific plane including a Y axis and a Z axis, and an XZ plane means a specific plane including an X axis and a Z axis. However, the directions and planes are used to describe the present invention such that the present invention can be clearly understood. Therefore, the directions and planes may be differently defined according to circumstances.

In the specification, the term "front" means the direction which the surface of a display panel, from which a picture is output, faces. According to this definition, the front and the rear of a display panel are the same through all parts of the display panel in the case in which the display panel is flat. In the case in which the display panel is curved, however, the front and the rear of a display panel are different through each part of the display panel. However, the terms "front" and "rear" are used to describe the present invention such that the present invention can be clearly understood. Therefore, the terms "front" and "rear" may be differently defined according to circumstances.

In the following description, the terms "first," "second," "third," etc. are used only to avoid confusion between designated components, and do not indicate the sequence or importance of the components or the relationships between the components. For example, a display apparatus may include only a second component, and may lack a first component.

A display panel according to the present invention may be formed in a flat shape, a shape having a two-dimensional curvature, or a shape having a three-dimensional curvature. A reinforcement member may be formed so as to have a curvature, whereby the display panel may be formed so as to have a curvature based on the shape of the reinforcement member. In the present invention, a flat display panel will be described. However, the present invention is not limited thereto.

The "facing direction" of the display panel means the direction that the front surface of the display panel faces. A "predetermined picture output direction," which is the direction in which light of the picture is radiated toward a user, means the direction that is set when the display panel is installed. In the present invention, the predetermined picture output direction is a positive Y-axis direction (the forward direction of the display panel in a closed state).

The "closed state" of the display panel means a state in which the facing direction of the display panel becomes the predetermined picture output direction. An "open state" means the state in which the display panel is rotated about a axis of rotation such that the facing direction of the display panel is a direction different from the picture output direction. In the following description, a first component being "fixed" to a second component means that the first component may be attached to a third component, which is attached to the second component, such that the first component and the second component are connected to each other as well as the case in which the first component is directly attached to the second component.

The display apparatus according to the present invention may include a single display panel. Alternatively, the display apparatus may include a plurality of display modules, each of which includes a display panel.

Referring to FIG. 1, a display apparatus 100 includes a display panel 10 for showing a picture. The display panel 10 may be flexible. For example, the display panel 10 may be an OLED display panel.

The display panel 10 includes a panel support member 30 disposed at the rear surface of the display panel 10. The panel support member 30 supports the display panel 10.

The display apparatus 100 includes a hinge member 50 fixed to the panel support member 30. The hinge member 50 rotates the panel support member 30 about a axis of rotation O. The panel support member 30 and the display panel 10 may be rotated about the axis of rotation O in a direction w.

The display apparatus 100 includes a control device 60 for controlling a picture signal of the display panel 10. The control device 60 controls the supply of power to the display panel 10.

The display panel 10 includes a hinge support member 70 for fixing the hinge member 50. The hinge support member 70 supports the display panel 10 and the panel support member 30 connected to the hinge member 50. The hinge support member 70 supports the control device 60 fixed to the panel support member 30.

The display panel 10 may have a layered structure. The display panel 10 may include a light emitting device (not shown), a base layer (not show) on which the light emitting device is disposed, the base layer being disposed at the rear surface of the light emitting device, and a cover layer (not shown) for covering the front surface of the light emitting device. The base layer and/or the cover layer may include a plurality of layers. The light emitting device may be disposed between the base layer and the cover layer in a sealed state. For example, the light emitting device may be an OLED, the base layer may be made of a thin glass material or a thin metal material, such as a metal alloy, and the cover layer may be made of a thin transparent material. In this embodiment, the base layer is made of Invar having a thickness of 0.1 T (0.1 mm), and the cover is made of glass having a thickness of 0.7 T (0.7 mm). In this embodiment, the light emitting device is an OLED, and the display panel 10 is flexible. Invar is an alloy of nickel and iron.

Referring to FIGS. 2 and 3, an imaginary plane P, in which the axis of rotation O is disposed and which is perpendicular to the front surface of the display panel 10, is defined for the convenience of description. That is, the imaginary plane P is a plane perpendicular to the front surface of the display panel 10 selected from among a large number of planes including the axis of rotation O. The display panel 10 includes a first portion 11, which is disposed in one side (first side) of the two regions divided by the imaginary plane P, and a second portion 15, which is disposed in the other side (second side).

The first portion 11 may rotate about the axis of rotation O while protruding forward. The second portion 15 may rotate about the axis of rotation O while protruding rearward. When one of the first portion 11 and the second portion 15 rotates while protruding forward, the other rotating unit rotates while protruding rearward. In FIGS. 2 and 3, w1 indicates the direction in which the first portion 11 rotates, and w2 indicates the direction in which the second portion 15 rotates.

The rear surface of the end portion of the first portion 11 in the first side direction (i.e. in the direction in which the first portion 11, which is disposed in one of the two regions divided by the imaginary plane P, is located) may be exposed. The display panel 10 includes a rear exposed portion 11a, through which the rear surface of the first portion 11 is exposed. The rear exposed portion 11a is disposed at the end portion of the side of the first portion 11 having the largest rotating radius. In the case in which the display panel 10 is flexible, the rear exposed portion 11a may be flexibly curved by external force.

In addition, the rear surface of the end portion of the second portion 15 in the second side direction (i.e. in the direction in which the second portion 15, which is disposed in the other of the two regions divided by the imaginary plane P, is located) may be exposed. The display panel 10 includes an additional rear exposed portion (not shown), through which the rear surface of the second portion 15 is exposed. The additional rear exposed portion is disposed at the end portion of the side of the second portion 15 having the largest rotating radius. In the case in which the display panel 10 is flexible, the additional rear exposed portion may be flexibly curved by external force.

When the rear surface of the display panel 10 is viewed perpendicularly, the end portion of the first portion 11 in the first side direction is provided so as to have a larger exposed rear area than the end portion of the second portion 15 in the second side direction. the end portion in the first side direction of the first portion 11 has a larger exposed rear area than a exposed rear area of the end portion in the second side direction of the second portion 15. That is, the rear surface of the end portion of the first portion 11 in the first side direction may be exposed, and the rear surface of the end portion of the second portion 15 in the second side direction may not be exposed. Alternatively, the rear surface of the end portion of the second portion 15 in the second side direction may be exposed while having a smaller exposed area than the rear surface of the end portion of the first portion 11 in the first side direction.

The display panel 10 may be formed in the shape of a plate having a predetermined thickness. When viewed from the front, the display panel 10 may be formed in a quadrangular shape. The display panel 10 may include a side end parallel to the axis of rotation O. The display panel 10 may include two side ends parallel to the axis of rotation O. In this embodiment, the axis of rotation O is parallel to the Z axis, and the display panel 10 includes two side ends parallel to the Z axis. The display panel 10 may include a side end perpendicular to the axis of rotation O. The display panel 10 may include two side ends perpendicular to the axis of rotation O. The display panel 10 may be formed in a quadrangular shape defined by two side ends parallel to the axis of rotation O and two side ends perpendicular to the axis of rotation O. One of the two side ends of the display panel 10 parallel to the axis of rotation O that is relatively distant from the axis of rotation O is a side end of the first portion 11. The other of the two side ends of the display panel 10 parallel to the axis of rotation O, which is relatively close to the axis of rotation O, is a side end of the second portion 15.

Referring to FIGS. 1 to 3, the end of the first portion 11 in the first side direction (i.e. in the direction in which the first portion 11, which is disposed in one of the two regions divided by the imaginary plane P, is located) defines a first predetermined length d1, indicating a distance from the imaginary plane P. The end of the panel support member 30 in the first side direction defines a second predetermined length d2, indicating a distance from the imaginary plane P. The end of the panel support member 30 may be distant from the imaginary plane P by the second predetermined length d2, which is shorter than the first predetermined length d1, in the first side direction. The rear surface of the first portion 11 is exposed by the difference between the first predetermined length d1 and the second predetermined length d2 (the rear exposure length L). The rear exposure length L is the length of the rear exposed portion 11a in the XY plane. When the rear surface of the display panel 10 is viewed perpendicularly, the panel support member 30 is disposed so as to entirely cover the rear surface of the first portion 11, excluding the end portion of the first portion 11 in the first side direction. When the rear surface of the display panel 10 is viewed perpendicularly, the panel support member 30 is disposed so as to entirely cover the rear surface of the first portion 11 excluding the rear exposed portion 11a.

The end of the second portion 15 in the second side direction (i.e. in the direction in which the second portion 15, which is disposed in the other of the two regions divided by the imaginary plane P, is located) defines a third predetermined length d3, indicating a distance from the imaginary plane P. The end of the panel support member 30 in the second side direction defines a fourth predetermined length d4, indicating a distance from the imaginary plane P. The end of the panel support member 30 may be distant from the imaginary plane P by the fourth predetermined length d4, which is equal to or longer than the third predetermined length d3, in the second side direction. In this embodiment, the third predetermined length d3 is shorter than the fourth predetermined length d4. Alternatively, the third predetermined length d3 may be equal to or longer than the fourth predetermined length d4.

In the case in which the fourth predetermined length d4 is equal to or longer than the third predetermined length d3, the panel support member 30 may be disposed so as to entirely cover the rear surface of the second portion 15, when the rear surface of the display panel 10 is viewed perpendicularly.

In the case in which the fourth predetermined length d4 is shorter than the third predetermined length d3, the second portion 15 may include the additional rear exposed portion. In this case, the panel support member 30 may be disposed so as to entirely cover the rear surface of the second portion 15 excluding the additional rear exposed portion, when the rear surface of the display panel 10 is viewed perpendicularly.

When the rear surface of the display panel 10 is viewed perpendicularly, the panel support member 30 is disposed so as to entirely cover the rear surface of the display panel excluding the rear exposed portion 11a. The panel support member 30 is coupled to the rear surface of the display panel 10 excluding the rear exposed portion 11a.

The first predetermined length d1 is longer than the third predetermined length d3. The second predetermined length d2 is longer than the fourth predetermined length d4. In the XY plane, the length d1 of the first portion 11 is longer than the third predetermined length d3 of the second portion 15. In the XY plane, a hinge member 50 or 50' is disposed so as to be eccentric to one of the opposite sides of the panel support member 30.

The panel support member 30 includes a rear panel 31 coupled to the rear surface of the display panel 10. The rear panel 31 may be formed in the shape of a plate having a predetermined thickness. In this embodiment, the rear panel 31 has a thickness of 1.2 T (1.2 mm) and is made of Al.

When viewed from the front, the rear panel 31 may be formed in a quadrangular shape. The rear panel 31 may include a side end parallel to the axis of rotation O. The rear panel 31 may include two side ends parallel to the axis of rotation O. In this embodiment, the axis of rotation O is parallel to the Z axis, and the rear panel 31 includes two side ends parallel to the Z axis. The rear panel 31 may include a side end perpendicular to the axis of rotation O. The rear panel 31 may include two side ends perpendicular to the axis of rotation O. The rear panel 31 may be formed in a quadrangular shape defined by two side ends parallel to the axis of rotation O and two side ends perpendicular to the axis of rotation O. One of the two side ends of the rear panel 31 parallel to the axis of rotation O that is relatively distant from the axis of rotation O is disposed at the rear surface of the first portion 11. The other of the two side ends of the rear panel 31 parallel to the axis of rotation O that is relatively close to the axis of rotation O is disposed at the rear surface of the second portion 15. The rear exposed portion 11a is disposed at a portion that is more distant from the axis of rotation O than one of the two side ends of the rear panel 31 parallel to the axis of rotation O that is relatively distant from the axis of rotation O. The additional rear exposed portion is disposed at a portion that is more distant from the axis of rotation O than the other of the two side ends of the rear panel 31 parallel to the axis of rotation O that is relatively close to the axis of rotation O. The rear surface of the second portion 15 is exposed through the additional rear exposed portion.

When the rear surface of the display panel 10 is viewed perpendicularly, the rear panel 31 may be disposed so as to entirely cover the rear surface of the first portion 11 excluding the end portion of the first portion 11 in the first side direction (i.e. in the direction in which the first portion 11, which is disposed in one of the two regions divided by the imaginary plane P, is located).

For example, when the rear surface of the display panel 10 is viewed perpendicularly, the rear panel 31 may be disposed so as to entirely cover the rear surface of the display panel 10 excluding the rear exposed portion 11a. When the rear surface of the display panel 10 is viewed perpendicularly, the rear panel 31 may be disposed so as to entirely cover the rear surface of the second portion 15.

In another example, when the rear surface of the display panel 10 is viewed perpendicularly, the rear panel 31 may be disposed so as to entirely cover the rear surface of the display panel 10 excluding the rear exposed portion 11a and the additional rear exposed portion. When the rear surface of the display panel 10 is viewed perpendicularly, the rear panel 31 may be disposed so as to entirely cover the rear surface of the second portion 15 excluding the additional rear exposed portion.

In an embodiment including the additional rear exposed portion, the rear exposed portion 11a may have a larger area than the additional rear exposed portion. The length L of the rear exposed portion 11a in the XY plane may be longer than the length (not shown) of the additional rear exposed portion in the XY plane. The exposed area of the rear surface of the end portion of the first portion 11 may be larger than that of the rear surface of the end portion of the second portion 15.

The display apparatus 100 may include an attachment member 32 for attaching the rear surface of the display panel 10 to the front surface of the rear panel 31. The attachment member 32 couples the rear surface of the display panel excluding the rear exposed portion 11a to the rear panel 31. The attachment member 32 may include an adhesive material. The attachment member 32 may be a double-sided tape or an adhesive. The attachment member 32 may include a magnetic material. The attachment member 32 may be disposed between the display panel 10 and the rear panel 31. The attachment member 32 may be formed to have a thin layer.

Referring to FIGS. 1, 7, and 8, a panel support member 30 or 30' may include hinge fixing member 35 or 35', which is coupled to the hinge member 50. The hinge fixing member 35 or 35' is fixed to the rear panel 31. The hinge fixing member 35 or 35' fixes the hinge member 50, a description of which will follow. The hinge fixing member 35 or 35' fixes a first hinge member 51, a description of which will follow. The hinge fixing member 35 or 35' is coupled to the rear panel 31 and to the first hinge member 51. Of course, the first hinge member 51 may be directly coupled to the rear panel 31.

The rear panel 31 may include a rear protrusion 31a, which is coupled to the hinge fixing member 35 or 35'. The rear protrusion 31a protrudes rearward from the rear surface of the rear panel 31. The rear protrusion 31a may be formed in the shape of a column protruding in the rearward direction of the rear panel 31. The protruding end portion of the rear protrusion 31a is coupled to the hinge fixing member 35 or 35'. The rear protrusion 31a and the hinge fixing member 35 may be fastened to each other using a fastening member, such as a screw.

The hinge fixing member 35 or 35' may be formed in the shape of a bar. The hinge fixing member 35 or 35' may be parallel to the axis of rotation O. The hinge fixing member 35 or 35' may extend in the direction parallel to the axis of rotation O. In a predetermined section (plane) perpendicular to the axis of rotation O, the sections of the hinge fixing member 35 or 35' may be bent. In the predetermined section, the hinge fixing member 35 or 35' may include a plate part forming a surface that is coupled to the first hinge member 51 and a plate part bent forward from the plate part forming the surface that is coupled to the first hinge member 51. In an embodiment shown in FIG. 7, only one forwardly bent plate part is formed, and the section of the hinge fixing member 35 is formed in an L shape. In another embodiment shown in FIG. 8, two forwardly bent plate parts are formed, and the section of the hinge fixing member 35' is formed in a bracket shape. The rear protrusion 31a is coupled to the front surface of the plate part forming the surface that is coupled to the first hinge member 51, and the first hinge member 51 is coupled to the rear surface of the plate part forming the surface that is coupled to the first hinge member 51. The hinge fixing member 35 or 35' increases the rigidity of the panel support member 30 or 30' in the direction parallel to the axis of rotation O.

Referring to FIG. 1, the panel support member 30 may include a reinforcement member 37 for increasing the rigidity of the panel support member 30. The reinforcement member 37 may increase the flexural rigidity of the panel support member 30. The reinforcement member 37 may be disposed at the edge of the panel support member 30. The reinforcement member 37 may be coupled to the rear panel 31.

Referring to FIGS. 1 and 3 to 5, the reinforcement member 37 may include a first reinforcement member 37a disposed perpendicular to the axis of rotation O. The first reinforcement member 37a extends in the direction perpendicular to the axis of rotation O. The first reinforcement member 37a is fixed to at least one of the opposite side ends of the rear panel 31 in the Z-axis direction. The first reinforcement member 37a may be disposed at each side end of the rear panel 31 in the Z-axis direction. In a section (plane) perpendicular to the front surface of the display panel 10 and parallel to the axis of rotation O, the first reinforcement member 37a may be formed to have a bent shape. The first reinforcement member 37a may have a surface that contacts the rear surface of the rear panel 31. The first reinforcement member 37a may have a surface that contacts the side end of the rear panel 31.

Referring to FIG. 1, the reinforcement member 37 may include a second reinforcement member 37b disposed parallel to the axis of rotation O and disposed at the rear surface of the first portion 11. The second reinforcement member 37b may extend in the direction parallel to the axis of rotation O. The second reinforcement member 37b may be disposed at one of the opposite side ends of the rear panel 31 that is relatively distant from the axis of rotation O in the XY plane. The second reinforcement member 37b is disposed between the first reinforcement members 37a. The second reinforcement member 37b is disposed between the end portions of the first reinforcement members 37a. The second reinforcement member 37b is fixed to the rear panel 31. In a section (plane) perpendicular to the front surface of the display panel 10 and perpendicular to the axis of rotation O, the second reinforcement member 37b may be formed to have a bent shape. The second reinforcement member 37b may have a surface that contacts the rear surface of the rear panel 31.

In another embodiment shown in FIG. 8, a reinforcement member 37' may include a third reinforcement member 37c' disposed parallel to the axis of rotation O and disposed at the rear surface of the second portion 15. The third reinforcement member 37c' may extend in the direction parallel to the axis of rotation O. The third reinforcement member 37c' may be disposed at the other of the opposite side ends of the rear panel 31 that is relatively close to the axis of rotation O in the XY plane. The third reinforcement member 37c' is disposed between the first reinforcement members 37a. The third reinforcement member 37c' is disposed between the end portions of the first reinforcement members 37a. The third reinforcement member 37c' is fixed to the rear panel 31. The real panel 31 may include a reinforcement member fastening part 31b that is coupled to the third reinforcement member 37c'. The reinforcement member fastening part 31b may protrude rearward from the rear surface of the rear panel 31. In a section (plane) perpendicular to the front surface of the display panel 10 and perpendicular to the axis of rotation O, the third reinforcement member 37c' may be formed to have a bent shape. The third reinforcement member 37c' may have a surface that contacts the rear surface of the rear panel 31.

The display apparatus 100 may further include an auxiliary attachment member 32' for attaching the rear surface of the display panel 10 to the front surface of the third reinforcement member 37c'. The third reinforcement member 37c' may have a surface that is coupled to the rear surface of the display panel by the auxiliary attachment member 32'. The third reinforcement member 37c' may be disposed between the rear panel 31 and the hinge fixing member 35.

The second reinforcement member 37b may be formed so as to have a curvature in the XY plane such that the display panel 10 has a curvature in the XY plane. The rear panel 31 coupled to the second reinforcement member 37b may be curved according to the curvature of the second reinforcement member 37b. The flexible display panel 10 may be curved according to the curvature of the second reinforcement member 37b.

The first reinforcement member 37a may be formed so as to have a curvature in the XZ plane such that the display panel 10 has a curvature in the XZ plane. The rear panel 31 coupled to the first reinforcement member 37a may be curved according to the curvature of the first reinforcement member 37a. The flexible display panel 10 may be curved according to the curvature of the first reinforcement member 37a.

In the display apparatus 100 including the third reinforcement member 37c', the third reinforcement member 37c' may be formed so as to have a curvature in the XZ plane such that the display panel 10 has a curvature in the XZ plane. The rear panel 31 coupled to the third reinforcement member 37c' may be curved according to the curvature of the third reinforcement member 37c'. The flexible display panel 10 may be curved according to the curvature of the third reinforcement member 37c'.

The flexible display panel 10 may be curved according to the curvature of the rear panel 31.

Referring to FIGS. 1 to 6, the display apparatus 100 includes a hinge member 50 or 50' having a predetermined axis of rotation O. The axis of rotation O may be parallel to the front surface of the display panel 10. In the case in which the display panel 10 has a curvature in the XY plane, the axis of rotation O may be parallel to the Z axis. In the case in which the display panel 10 has a curvature in the XZ plane, the axis of rotation O may be parallel to the Z axis.

The hinge member 50 includes a first hinge member 51 fixed to the panel support member 30. The first hinge member 51 is coupled to the panel support member 30. The first hinge member 51 is coupled to the hinge fixing member 35. The first hinge member 51 has a coupling surface that is coupled to the hinge fixing member 35. The first hinge member 51 is fastened to the hinge fixing member 35 using a fastening member, such as a screw. The axis of rotation O of the first hinge member 51 is preset even in the state in which the first hinge member 51 is not coupled to a second hinge member 52, a description of which will follow. In the case in which the first hinge member 51 is fixed to the panel support member 30, the position of the axis of rotation O relative to the panel support member 30 is set. In the case in which the first hinge member 51 is fixed to the panel support member 30, the position of the axis of rotation O relative to the display panel 10 is set.

The hinge member 50 includes a second hinge member 52 fixed to the hinge support member 70. The second hinge member 52 is coupled to the hinge support member 70. The second hinge member 52 is coupled to a main support member 71, a description of which will follow. The second hinge member 52 has a coupling surface that is coupled to the main support member 71. The second hinge member 52 is fastened to the main support member 71 using a fastening member, such as a screw. The axis of rotation O of the second hinge member 52 is preset even in the state in which the second hinge member 52 is not coupled to the first hinge member 51.

Referring to FIGS. 4 and 5, the first hinge member 51 and the second hinge member 52 are coupled to each other so as to be rotatable about the axis of rotation O. The axis of rotation O is preset even in the state in which the first hinge member 51 and the second hinge member 52 are not coupled to each other. The first hinge member 51 and the second hinge member 52 are coupled to each other such that the axis of rotation O of the second hinge member 52 is aligned with the axis of rotation O of the second hinge member 52. One of the first hinge member 51 and the second hinge member 52 has a hinge shaft protruding toward the axis of rotation O, and the other has a hinge hole, into which the hinge shaft is inserted. In this embodiment, the second hinge member 52 has a hinge shaft, and the first hinge member 51 has a hinge hole. When the first hinge member 51 is moved to the second hinge member 52 in the direction indicated by the arrow shown in FIG. 4, the first hinge member 51 and the second hinge member 52 are coupled to each other as shown in FIG. 5.

A hinge member 50 according to an embodiment shown in FIG. 2 is disposed at the rear surface of the second portion 15. In this embodiment, a first hinge member 51 is coupled to the panel support member 30 at the rear surface of the second portion 15, and a second hinge member 52 is coupled to the hinge support member 70 at the rear surface of the second portion 15. A hinge member 50' according to another embodiment shown in FIG. 3 is disposed at the rear surface of the first portion 11. In this embodiment, a first hinge member 51' is coupled to the panel support member 30 at the rear surface of the first portion 11, and a second hinge member 52' is coupled to the hinge support member 70 at the rear surface of the first portion 11. In a further embodiment, although not shown, one of the first hinge member and the second hinge member may be disposed at the rear surface of the first portion 11, and the other may be disposed at the rear surface of the second portion 15. In all embodiments, the axis of rotation O may be maintained uniform.

Referring to FIG. 4, a display apparatus 100 according to an embodiment of the present invention may be manufactured in the state in which only the first hinge member 51 is coupled to the panel support member 30. In this case, the first hinge member 51 may be assembled to the second hinge member 52, which is coupled to the hinge support member 70, on site.

Referring to FIG. 6, a display apparatus 100 according to another embodiment of the present invention may be manufactured in the state in which both the first hinge member 51 and the second hinge member 52 are coupled to the panel support member 30. In this case, the second hinge member 52 may be fastened to the hinge support member 70 on site.

Referring to FIG. 1, the control device 60 may be disposed at the rear surface of the display panel 10. The control device 60 may be fixed to the rear surface of the panel support member 30. The control device 60 may be fixed to the rear surface of the rear panel 31. The control device 60 may include a control box 61 for receiving a printed circuit board (PCB), etc. The control device 60 may include a control box fixing member for fixing the control box 61 to the rear surface of the panel support member 30. The control box fixing member is fastened to the rear surface of the rear panel 31. The control box 61 is fastened to the control box fixing member. Various lines, such as a power supply line and a picture signal input line, may be connected to the control box 61. The lines may be disposed at the rear surface of the panel support member 30.

The control device 60 rotates together with the panel support member 30. When the display panel 10 is viewed in a predetermined direction in which the picture is output in the closed state, the control device 60 is not visible. In the open state, the control device 60 is exposed such that a user can easily access the control device 60.

Referring to FIG. 1, the hinge support member 70 includes a main support member 71 for directly supporting the hinge member 50. The main support member 71 is coupled to the second hinge member 521. The main support member 71 may be formed in the shape of a column. The main support member 71 may extend in the direction parallel to the axis of rotation O. The main support member 71 may have opposite side surfaces formed in the X-axis direction. The main support member 71 may have opposite side surfaces formed in the Y-axis direction. The axis of rotation O is disposed at the edge of the main support member 71 at which one side (first side) surface of the main support member 71 in the X-axis direction and one side (first side) surface of the main support member 71 in the Y-axis direction intersect. Specifically, on the assumption that one of the X-axis opposite side surfaces of the main support member 71 at which the second portion 15 is disposed is a first side surface (not shown) and one of the Y-axis opposite side surfaces of the main support member 71 at which the panel support member 30 is disposed is a second side surface (not shown), the axis of rotation O is disposed at the edge of the main support member 71 at which the first side surface and the second side surface intersect. As a result, the rotating motion of the first portion 11 in the direction w1 is not interfered with, and the rotating motion of the second portion 15 in the direction w2 is not interfered with.

The hinge support member 70 may include a first auxiliary support member 73 coupled to one end of the main support member 71. A pair of first auxiliary support members 73 may be disposed at opposite ends of the main support member 71. The first auxiliary support members 73 may be disposed at opposite sides of the main support member 71 in the Z-axis direction. Each first auxiliary support member 73 may extend perpendicular to the axis of rotation O. Each first auxiliary support member 73 may extend in the X-axis direction. Each first auxiliary support member 73 may have opposite side surfaces formed in the Z-axis direction. Each first auxiliary support member 73 may have opposite side surfaces formed in the Y-axis direction.

The hinge support member 70 may include a second auxiliary support member 75 coupled to one end of each first auxiliary support member 73. The second auxiliary support member 75 may be disposed between the first auxiliary support members 73. Opposite ends of the second auxiliary support member 75 may be connected to the first auxiliary support members 73. The second auxiliary support member 75 may extend parallel to the axis of rotation O. The second auxiliary support member 75 may extend in the Z-axis direction. The second auxiliary support member 75 may have opposite side surfaces formed in the X-axis direction. The second auxiliary support member 75 may have opposite side surfaces formed in the Y-axis direction.

When viewed in the Y-axis direction, a space 70*a* may be formed in the middle part of the hinge support member 70. The space 70*a* may be a hole. The space 70*a* may be defined by the main support member 71, the first auxiliary support members 73, and the second auxiliary support member 75. The hinge support member 70 may be formed in the shape of a frame, the edges of which are connected. The space 70*a* may be formed in the middle of the frame. In the closed state, at least a portion of the control device 60 is dispose in the space 70*a*.

A stopper (not shown) for limiting the rotating angle of the panel support member 30 may be disposed at the hinge support member 70. The stopper may include a closed-state stopper (not shown) for preventing the first portion 11 from rotating further while being pushed rearward in the closed state. The stopper may include an open-state stopper (not shown) for preventing the second portion 15 from rotating further while being pushed rearward in the open state. The stopper may be disposed at the panel support member 30. The stopper may be disposed at the hinge member 50. The stopper may be provided such that the display panel can rotate within a maximum of 90 degrees in the closed state.

The display apparatus 100 may further include a locking device (not shown) for locking the display panel 10 in the closed state such that the display panel 10 can rotate only when the locking device is released.

Hereinafter, a display apparatus 100 including at least two display modules 100*a*, 100*b*, and 100*c* will be described with reference to FIGS. 9 to 19. The constructions of the display modules 100*a*, 100*b*, and 100*c* that are identical to those described above will be omitted.

Referring to FIGS. 9 to 16, the display module 100*a* or 100*b* includes the display panel 10 and the panel support member 30. The display module 100*a* or 100*b* may further include the hinge member 50, the hinge support member 70, and the control device 60.

In the case in which, in the state in which two display modules 100*a* and 100*b*' (see FIG. 9) or 100*a*" or 100*b* (see FIG. 10), only the display module 100*b*' or 100*a*" includes the hinge member 50 (see FIGS. 9 and 10), the present invention may be embodied. The display modules 100*a* and 100*b* (see FIG. 11) including the hinge member 50 are provided to have the closed state (see FIGS. 11 to 13) and the open state (see FIGS. 14 to 16). The display modules 100*a* and 100*b* including the hinge member 50 includes a first portion 11 rotatable while protruding forward when the closed state is switched to the open state. The display modules 100*a* and 100*b* including the hinge member 50 may include a second portion 15 rotatable while protruding rearward when the closed state is switched to the open state.

In the closed state, a portion of the rear surface of one 100*b* or 100*b*' of the two display modules 100*a* and 100*b*, 100*a* and 100*b*', or 100*a*" and 100*b* contacts a portion of the front surface of the other 100*a* or 100*a*". In the open state, the two display modules 100*a* and 100*b*, 100*a* and 100*b*', or 100*a*" and 100*b*, which are in contact with each other in the closed state, are separated from each other.

In the closed state, a portion of the rear surface of the display panel 10 of one 100*b* or 100*b*' of the two display modules 100*a* and 100*b*, 100*a* and 100*b*', or 100*a*" and 100*b* contacts a portion of the front surface of the display panel 10 of the other 100*a* or 100*a*". In the open state, the two display panels 10, which are in contact with each other in the closed state, are separated from each other.

Hereinafter, one 100*a* or 100*a*" of the two display modules 100*a* and 100*b*, 100*a* and 100*b*', or 100*a*" and 100*b* will be referred to as a main display module, and the other 100*b* or 100*b*' will be referred to as a neighboring display module.

Referring to FIG. 9, which shows a first embodiment of the present invention, only one 100*a* of the two display modules 100*a* and 100*b*' arranged in the X-axis direction includes a hinge member 50. The display module 100*a* including the hinge member 50 includes a second portion 15, and the display module 100*b*' not including the hinge member 50 is disposed so as to overlap a portion of the rotating path of the second portion 15. In the closed state, a portion of the front surface of the second portion 15 contacts a portion of the rear surface of the display panel 10 of the neighboring display module 100*b*'. In the open state, the second portion 15 rotates rearward, whereby the contact between the display panels 10 of the display modules 100*a* and 100*b*' is released. The display panel 10 of the neighboring display module 100*b*' includes a rear exposed portion 11*a*. The rear exposed portion 11*a* is disposed so as to overlap a portion of the rotating path of the second portion 15. The rear exposed portion 11*a* of the neighboring display module 100*b*' is identical in construction to the rear exposed portion 11*a* of the main display module 100*a*, excluding the connection with the first portion 11. The neighboring display module 100*b*' may include a fixing member 80' for fixedly coupling the panel support member 30 to the hinge support member 70. The panel support member 30 of the neighboring display module 100*b*' is coupled to the rear surface of the display panel 10 of the neighboring display module 100*b*' to cover the rear surface of the display panel 10 of the neighboring display module 100*b*' but to expose the portion of the rear surface of the display panel 10 of the neighboring display module 100*b*' that contacts at least the front surface of the display panel 10 of the main display module 100*a*.

Referring to FIG. 10, which shows a second embodiment of the present invention, only one 100*b* of the two display modules 100*a*'' and 100*b* arranged in the X-axis direction includes a hinge member 50. The display module 100*b* including the hinge member 50 includes a first portion 11, and the display module 100*a*'' not including the hinge member 50 is disposed so as to overlap a portion of the rotating path of the first portion 11. In the closed state, a portion of the rear surface of the first portion 11 contacts a portion of the front surface of the display panel 10 of the main display module 100*a*''. In the open state, the first portion 11 rotates rearward, whereby the contact between the display panels 10 of the display modules 100*a*'' and 100*b* is released. The main display module 100*a*'' may include a fixing member 80'' for fixedly coupling the panel support member 30 to the hinge support member 70. The display panel 10 of the neighboring display module 100*b* includes a rear exposed portion 11*a*. The rear exposed portion 11*a* is formed at the side end of the first portion 11. The panel support member 30 of the neighboring display module 100*b* is coupled to the rear surface of the display panel 10 of the neighboring display module 100*b* to cover the rear surface of the display panel 10 of the neighboring display module 100*b* but to expose the portion of the rear surface of the display panel 10 of the neighboring display module 100*b* that contacts at least the front surface of the display panel 10 of the main display module 100*a*''.

Referring to FIGS. 11 to 16, which show a third embodiment of the present invention, each of the display modules 100*a* and 100*b* includes a hinge member 50. In the third embodiment, each of the two display modules 100*a* and 100*b* arranged in the X-axis direction includes a hinge member 50. One 100*a* of the two display modules 100*a* and 100*b* includes a second portion 15, and the other 100*b* includes a first portion 11. However, the present invention is not limited thereto. In the closed state, a portion of the front surface of the second portion 15 contacts a portion of the rear surface of the display panel 10 of the neighboring display module 100*b*. In the state in which at least one of the display modules 100*a* and 100*b* is open, the first portion 11 rotates rearward, whereby the contact between the display panels 10 of the display modules 100*a* and 100*b* is released. The contact between the display panels 10 may be released by rotating the first portion 11 of the neighboring display module 100*b* forward. The contact between the display panels 10 may be released by rotating the second portion 15 of the main display module 100*a* rearward. The contact between the display panels 10 may be released by rotating the first portion 11 of the neighboring display module 100*b* forward and rotating the second portion 15 of the main display module 100*a* rearward. The first portion 11 of the neighboring display module 100*b* includes a rear exposed portion 11*a*.

Referring to FIGS. 9 to 11, the display panel 10 of one of the two display modules 100*a* and 100*b*, 100*a* and 100*b*', or 100*a*'' and 100*b* may be provided so as to be curved when contacting the display panel 10 of the other display module in the closed state. In the first to third embodiments, the rear exposed portion 11*a* of the neighboring display module 100*b* or 100*b*' is provided so as to be curved forward when contacting a portion of the front surface of the display panel 10 of the main display module 100*a* or 100*a*'' in the closed state.

In another embodiment, a portion of the front surface of the display panel 10 of the main display module 100*a* or 100*a*'' may be provided so as to be curved rearward when contacting a portion of the rear surface of the display panel 10 of the neighboring display module 100*b* or 100*b*' in the closed state. In this case, the two display panels 10 may be provided so as to be curved forward and rearward in the state in which the two display panels 10 are in contact with each other. In particular, in the case in which a portion of the rear surface of the display panel 10 of the main display module 100*a* or 100*a*'' that contacts the neighboring display module 100*b* or 100*b*' is exposed, the display panel 10 of the main display module 100*a* or 100*a*'' may be more easily curved rearward.

The panel support member 30 of the neighboring display module 100*b* or 100*b*' is coupled to the rear surface of the display panel 10 of the neighboring display module 100*b* or 100*b*' to cover the rear surface of the display panel 10 of the neighboring display module 100*b* or 100*b*' but to expose the portion of the rear surface of the display panel 10 of the neighboring display module 100*b* that contacts at least the front surface of the display panel 10 of the main display module 100*a* or 100*a*''.

Rotating axes Oa and Ob of the two display modules 100*a* and 100*b*, 100*a* and 100*b*', or 100*a*'' and 100*b* may be parallel to each other. In this embodiment, the rotating axes Oa of the main display module 100*a* or 100*a*'' and the rotating axes Ob of the neighboring display module 100*b* or 100*b*' are parallel to each other. The two rotating axes Oa and Ob may be parallel to the Z axis.

In the first and third embodiments, the second portion 15 of the main display module 100*a* is provided so as to be rotated only rearward when the closed state is switched to the open state. In the second and third embodiments, the first portion 11 of the neighboring display module 100*b* is provided so as to be rotated only forward when the closed state is switched to the open state.

In the third embodiment shown in FIGS. 11 to 16, the display panels 10 of the two display modules 100a and 100b may be provided so as to be rotated only in the same direction when the closed state is switched to the open state. Even in the state in which one of the two display modules 100a and 100b is open, the contact between the display panels 10 is released.

Referring to FIGS. 13 and 16, dimensions X1, X2, X3, Y1, Y2, L, and M of the two display modules 100a and 100b in the XY plane are defined as follows. The distance from the imaginary plane P to the side end of the second portion 15 is defined as a side end distance X1 of the main display module. The distance from an imaginary plane parallel to the Y axis, among planes in which the axis of rotation O of the main display module 100a is located, to the side end of the display panel 10 of the neighboring display module 100b in the closed state in the X-axis direction is defined as a side end distance X2 of the neighboring display module. The length of the rear exposed portion 11a of the neighboring display module 100b is defined as the rear exposure length L. The distance from an imaginary plane parallel to the Y axis, among planes in which the axis of rotation O of the main display module 100a is located, to the side end of the panel support member 30 of the neighboring display module 100b in the closed state in the X-axis direction is defined as a side end distance X3 of the panel support member of the neighboring display module. The side end distance X3 of the panel support member of the neighboring display module is the sum of the side end distance X2 of the neighboring display module and the rear exposure length L. The distance from an imaginary plane parallel to the display panel 10 of the main display module 100a, among planes in which the axis of rotation O of the main display module 100a is located, to the front surface of the display panel 10 of the main display module 100a is defined as a front distance Y1 of the main display module. The distance from an imaginary plane parallel to the X axis, among planes in which the axis of rotation O of the main display module 100a is located, to the front surface of the display panel 10 of the neighboring display module 100b in the closed state in the Y-axis direction is defined as a front distance Y2 of the neighboring display module. The length by which the front surface of the display panel 10 of the main display module 100a and the rear surface of the display panel 10 of the neighboring display module 100b contact each other in the state in which both the main display module 100a and the neighboring display module 100b are closed is defined as a contact length M.

The side end distance X1 of the main display module is greater than the side end distance X2 of the neighboring display module. The side end distance X1 of the main display module is equal to or less than the side end distance X3 of the panel support member of the neighboring display module. The contact length M is equal to or less than the rear exposure length L. The side end distance X1 of the main display module may be greater than the side end distance X2 of the neighboring display module and less than the side end distance X3 of the panel support member of the neighboring display module. The contact length M may be less than the rear exposure length L. The contact length M is a value obtained by subtracting the side end distance X3 of the panel support member of the neighboring display module from the sum of the side end distance X1 of the main display module and the rear exposure length L. The contact length M may be a length corresponding to the distance from the portion of the side end of the front surface of the display panel 10 of the main display module 100a that is relatively close to the axis of rotation thereof to the portion of the display panel in which no picture is output (hereinafter, referred to as a non-picture portion). One of the opposite ends of the front surface of the display panel 10 of the main display module 100a in the X-axis direction that has a longer non-picture portion may contact the rear surface of the display panel 10 of the neighboring display module 100b in the closed state.

The front distance Y1 of the main display module and the front distance Y2 of the neighboring display module are substantially equal. In the state in which both the main display module 100a and the neighboring display module 100b are closed, the rear exposed portion 11a of the neighboring display module 100b is curved while protruding forward by the thickness of the display panel 10.

Referring to FIGS. 17 to 19, the display apparatus 100 may include a plurality of display modules 100a, 100b, and 100c. FIG. 17 is a view showing the state in which all of the display modules 100a, 100b, and 100c are closed. FIG. 18 is a view showing the state in which all of the display modules 100a, 100b, and 100c are open. FIG. 19 is a view showing the state in which one of the display modules 100a, 100b, and 100c is open.

Three or more display modules may be provided. The display modules 100a, 100b, and 100c may be arranged in the X-axis direction. In other embodiments, the display modules 100a, 100b, and 100c may be connected to one another so as to have a curvature. The display modules 100a, 100b, and 100c may be connected to one another such that a portion of the front surface of the display panel 10 of one of the display modules may contact a portion of the rear surface of the display panel 10 of another of the display modules in the closed state.

The display modules 100a, 100b, and 100c may be the same. The display modules 100a, 100b, and 100c may each include the display panel 10, the panel support member 30, and the hinge member 50. The display modules 100a, 100b, and 100c may each include the control device 60. The display modules 100a, 100b, and 100c may each include the hinge support member 70.

As is apparent from the above description, according to the present invention, it is possible to individually repair or replace a plurality of display panels connected to each other. That is, it is not necessary to remove a display panel adjacent to another display panel to be repaired or replaced. Specifically, it is possible to open a display module without interference with a neighboring display module and then to repair or replace a control device, a display panel, or a panel support member of the display module. In the case in which three or more display modules are connected to one another, it is possible to easily repair or replace parts of the display module(s) between the outermost display modules as well as the outermost display modules.

In addition, the control devices, which are disposed at the rear surface of the display modules, are easily exposed as the result of rotating of the display panels in the open state, whereby it is possible to secure a sufficient space to individually repair or replace the display panels.

In addition, the display panels are arranged so as to overlap one another, whereby it is possible to minimize the area of non-picture portions located at the interfaces between the display panels.

In addition, a structure capable of coupling the display panels to a hinge support member in the open state irrespective of the direction in which the display panels are arranged may be provided, whereby it is possible to easily install a display panel between display panels that have been already installed. Specifically, in the case in which a plurality of display modules is installed, it is possible to install a display module in the open state without interference with a neighboring display module and then to switch from the open state of the display module to the closed state thereof.

In addition, a plurality of display modules may be modularized, whereby it is possible to increase efficiency with which the display modules are manufactured and installed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
a plurality of display modules comprising at least a first display module and a second display module each comprising a corresponding display panel and a corresponding panel support member disposed at a rear side of the display panel configured to support the display panel, wherein:
at least one of the first display module and the second display module comprises a hinge member fixed to the corresponding panel support member and configured to provide rotation of the corresponding panel support member about an axis of rotation;
the at least one of the first display module and the second display module comprising the hinge member is configured to have a closed state and an open state;
the at least one of the first display module and the second display module comprising the hinge member faces a same predetermined picture output direction in the closed state;
the at least one of the first display module and the second display module comprising the hinge member face a different direction than the picture output direction in the open state;
wherein the display panels of the first and second display modules are both visible in the closed state while facing the same predetermined picture output direction; and
a rear exposed portion at a rear side of one of the first and the second display module contacts a front portion at a front side of the other of the first and the second display modules when the first and the second display modules are in the closed state such that the predetermined picture output directions of the first and second display modules are the same.

2. The display apparatus according to claim 1, wherein the rear exposed portion is configured to curve in response to contacting the front portion in the closed state.

3. The display apparatus according to claim 1, wherein the panel support member corresponding to the one of the first and the second display panel is coupled to the rear side of the corresponding display panel and covers the rear side of the corresponding display panel excluding the rear exposed portion.

4. The display apparatus according to claim 1, wherein:
each of the first and the second display module comprise a corresponding hinge member;
each of the corresponding display panels of the first and the second display module comprise:
a first portion configured to rotate toward a forward direction when the corresponding display panel is rotated to the open state; and
a second portion configured to rotate toward a rear direction when the corresponding display panel is rotated to the open state; and
a portion at a front side of the second portion corresponding to one of the first and the second display module contacts a portion at a rear side of the first portion corresponding to the other of the first and the second display module when the first and the second display module are in the closed state.

5. The display apparatus according to claim 4, wherein the axes of rotation of the first and the second display module are parallel.

6. The display apparatus according to claim 5, wherein the each of corresponding display panels of the first and the second display module are configured to be rotated in the same direction when rotating from the closed state to the open state.

7. The display apparatus according to claim 1, wherein the at least one of the first display module and the second display module comprising the hinge member further comprises a hinge support member fixed to the hinge member and configured to support the display panel and the panel support member fixed to the hinge member.

8. The display apparatus according to claim 1, wherein each panel support member comprises:
a rear panel coupled to the rear side of the corresponding display panel; and
a reinforcement member disposed at an edge of the panel support member and coupled to the rear panel.

9. The display apparatus according to claim 1, wherein the panel support member corresponding to the at least one of the first display module and the second display module comprising the hinge member comprises:
a rear panel coupled to the rear side of the corresponding display panel;
a first reinforcement member perpendicular to the corresponding axis of rotation of the panel support member;
a second reinforcement member parallel to the corresponding axis of rotation and disposed at a distal side of the rear panel from the axis of rotation; and
a hinge fixing member fixed to the rear panel and configured to fix the hinge member, the hinge fixing member extending parallel to the axis of rotation.

* * * * *